(12) United States Patent
Tsujimoto

(10) Patent No.: US 9,689,902 B2
(45) Date of Patent: Jun. 27, 2017

(54) MAGNETORESISTANCE EFFECT ELEMENT

(71) Applicant: SIRC Co., LTD, Osaka (JP)

(72) Inventor: Hiroaki Tsujimoto, Osaka (JP)

(73) Assignee: SIRC CO., LTD, Osaka (JP)

( * ) Notice: Subject to any disclaimer, the term of this patent is extended or adjusted under 35 U.S.C. 154(b) by 0 days.

(21) Appl. No.: 14/646,377

(22) PCT Filed: Nov. 21, 2013

(86) PCT No.: PCT/JP2013/006855
§ 371 (c)(1),
(2) Date: May 20, 2015

(87) PCT Pub. No.: WO2014/080634
PCT Pub. Date: May 30, 2014

(65) Prior Publication Data
US 2015/0301089 A1    Oct. 22, 2015

(30) Foreign Application Priority Data

Nov. 22, 2012 (JP) ................................. 2012-256732

(51) Int. Cl.
*G01R 33/09* (2006.01)
*G01R 15/20* (2006.01)
(Continued)

(52) U.S. Cl.
CPC ........... *G01R 15/205* (2013.01); *G01R 21/08* (2013.01); *G01R 33/09* (2013.01); *G01R 33/096* (2013.01); *H01L 43/02* (2013.01); *H01L 43/08* (2013.01)

(58) Field of Classification Search
CPC ..................................................... G01R 33/09
(Continued)

(56) References Cited

U.S. PATENT DOCUMENTS 4,639,806 A * 1/1987 Kira et al. ............... 360/327.32
5,739,988 A    4/1998 Gill
(Continued)

FOREIGN PATENT DOCUMENTS

CN     102565508 A    7/2015
GB      2146482 A    4/1985
(Continued)

OTHER PUBLICATIONS

Abstract of JP-01-217283, Aug. 30, 1989.*
(Continued)

*Primary Examiner* — Bot Ledynh
(74) *Attorney, Agent, or Firm* — EIP US LLP

(57) ABSTRACT

When miniaturizing an ammeter or wattmeter, a magnetoresistance effect element given a barber-pole electrode could be considered an efficient device. It was considered that a barber-pole electrode formed at 45° with respect to an axis of easy magnetization (the longitudinal direction of a rectangular-shaped element) would be the most efficient. Current is refracted, however, when the current passes through the boundaries of substances with different conductivity, so a barber-pole electrode formed at 45° is not the most efficient. According to the invention, it is possible to provide a highly efficient magnetoresistance element having a rectangular magnetic film whereupon an axis of easy magnification is induced in the longitudinal direction, and a barber-pole electrode which is formed upon the magnetic film at an oblique angle θ to the longitudinal direction, where the magnetoresistance element takes into account current refraction at the boundary between the electrode and the magnetic film.

8 Claims, 12 Drawing Sheets

(51) Int. Cl.
*H01L 43/08* (2006.01)
*G01R 21/08* (2006.01)
*H01L 43/02* (2006.01)

(58) Field of Classification Search
USPC .......................................................... 324/252
See application file for complete search history.

(56) References Cited

U.S. PATENT DOCUMENTS

| | | |
|---|---|---|
| 2007/0159159 A1 | 7/2007 | Okada et al. |
| 2012/0161751 A1 | 6/2012 | Akiyama et al. |
| 2012/0161756 A1* | 6/2012 | Paci et al. ..................... 324/228 |
| 2012/0161759 A1* | 6/2012 | Pozzati et al. ................ 324/252 |
| 2012/0229133 A1 | 9/2012 | Zimmer et al. |
| 2013/0241543 A1* | 9/2013 | Stenson et al. ............... 324/252 |
| 2014/0049253 A1 | 2/2014 | Tsujimoto |

FOREIGN PATENT DOCUMENTS

| | | |
|---|---|---|
| JP | S5719533 A | 7/1980 |
| JP | S57036428 A | 2/1982 |
| JP | H01217283 A | 8/1989 |
| JP | H02165408 A | 6/1990 |
| JP | H06036239 A | 2/1994 |
| JP | H06236520 | 8/1994 |
| JP | H10105929 A | 4/1998 |
| JP | H10275314 A | 10/1998 |
| JP | 2875445 B2 | 3/1999 |
| JP | 2007187530 A | 7/2007 |
| WO | 20120105459 A1 | 8/2012 |

OTHER PUBLICATIONS

Partial Machine Translation of JP-01-217283, Aug. 30, 1989.*
International Search Report issued on Jan. 14, 2014 on related Application PCT/JP2013/006855, filed Nov. 21, 2013 and published as WO/2014/080634 on May 30, 2014.
Chinese Office Action dated Oct. 17, 2016 for Chinese Patent Application No. 201380068791.5.
Japanese Decision to Grant dated Nov. 2, 2016 for Japanese Patent Application No. 2012-256732.
Japanese Office Action dated Aug. 23, 2016 for Japanese Patent Application No. 2012-256732.
European Extended Search Report dated Aug. 10, 2016 for EP 13857243.3.

* cited by examiner

MAGNETORESISTANCE EFFECT ELEMENT

CROSS-REFERENCE TO RELATED APPLICATIONS

This application claims priority to Japanese Priority Patent Application JP 2012-256732 filed on Nov. 22, 2012, the entire contents of which are incorporated herein by reference.

TECHNICAL FIELD

The present invention relates to a magnetoresistance effect element which can be preferably used for current measurement and power measurement.

BACKGROUND ART

Recently, due to the environmental concerns, usage of natural energy such as solar power generation and wind power generation, developing new energy such as fuel battery, and energy saving including cars and home electronics are actively promoted. It is an important matter to reduce energy consumption and power consumption in the future in Japan and all over the world. It is considered that one of the solutions is "visualizing power consumption" of each electric equipment and electronic device, and realizing strengthening the management and control function of power charge and power consumption.

In a circumstance where internet and so on can be utilized in recent years, development of a power management system including remote meter reading of electricity meters has been progressed. Recently, measurement of macro power consumption of entire houses and factories and so on is performed, such as multiplication operation by a microprocessor or an electric circuit by adding a sensor for measuring rotations of an existing accumulating power meter or newly adding an ammeter (CT) or a power meter (PT).

However, these measurement apparatuses may be large and expensive, and useless energy may be consumed. Further, it is difficult to add a new measurement apparatus to existing equipment taking the vacant space of the existing equipment which is thickly designed and manufactured recently into consideration. Therefore, it is desired to develop smaller and more integrated power sensing devices.

To measure power, a meter accumulating electric energy, called a power meter or an informal meter is used. The most accessible one is induced type electric energy meter. This uses a disk of Arago. The disk made of aluminum is set to rotate with a speed proportional to the power, and the electric energy is measured by accumulating the rotation speed. However, such electric meter is too large to measure power consumption at a desired point of an electric circuit In Patent Literature 1, an apparatus which measures power using a magnetic sensor utilizing a magnetoresistance effect is disclosed. The magnetic sensor detects current utilizing a magnetic film, and thus, it is considered to be possible to mount the magnetic sensor on a relatively small circuit.

Further, the power meter of Patent Literature 1 measures voltage and current separately and operate them. However, in Patent Literature 2, a power meter measuring power only measuring voltage between both terminals of a magnetic sensor utilizing a magnetoresistance effect. In either case, if it is possible to manufacture small magnetic sensor utilizing magnetoresistance effect, the possibility to measure power consumption at a desired point occur.

The magnetoresistance effect is a phenomenon that an electric resistance varies depending on a magnetic field applied from outside. This phenomenon occurs by variation of a direction of a current flowing in a magnetic film and a magnetization direction formed in the magnetic film. Therefore, with regard to the magnetic field from outside, the magnetoresistance effect has a character of even function. Accordingly, to obtain linearity, it is necessary to apply a bias magnetic field on some level in advance in a direction same as that of the magnetic field from outside.

This may be a factor which makes it difficult to downsize the magnetic sensor. However, Patent Literature 1 discloses a magnetoresistance effect element which can use a linear portion of the magnetoresistance effect without apparently applying any bias magnetic field by locating barber-pole electrodes on the magnetic film. FIG. 12 shows a structure of the magnetoresistance effect element 100 on which the barber-pole electrodes are located.

A magnetic film 112 having a strip shape is normally formed on a substrate 111. A magnetization easy axis EA is induced in a longitudinal direction of the strip shape in the magnetic film 112. Permalloy, which is a composition metal of iron and nickel, is preferably used for the magnetic film 112, for example. Electrodes called barber-pole electrodes 114 are formed on this magnetic film 112. The barber-pole electrodes 114 have inclined sides 114$p$ with regard to the longitudinal direction of the strip shape and are belt-like films having superior electric conductivity. The material is formed of copper, zinc, nickel, aluminium, silver or a composition metal of these.

In these barber-pole electrodes 114, when current $I_2$ flows between connection electrodes 116$a$ and 116$b$ at both sides of the magnetoresistance effect element 100, current flows from one inclined side 114$p$ to another inclined side 114$p$. Then, the current $I_2$ flows in a direction different from the longitudinal direction (magnetization direction of the magnetic film 112) of the stripe-shaped magnetic film 112, and thus, it is possible to use the linear portion of the magnetoresistance effect without any bias.

CITATION LIST

Patent Literature

Patent Literature 1: JP 2007-187530 A
Patent Literature 2: WO 2012/105459

SUMMARY OF INVENTION

Problem to be Solved

The barber-pole electrodes 114 disclosed in Patent Literature 1 are formed to have inclined sides 114$p$ whose inclined angle θ is 45 degrees with regard to the longitudinal direction of the strip-shaped magnetic film 112. This is because it is considered that the magnetoresistance effect is an even function with regard to an outside magnetic field, and thus, the linear portion can be used most effectively when the angle between the magnetization and the current is 45 degrees.

However, since the material quality of the barber-pole electrodes 114 and that of the magnetic film 112 is different, the current does not always flow with the angle θ determined by the configuration of the barber-pole electrodes 114. The report example studying this point in detail is hardly found. From a view point that it is unnecessary to arrange a separate magnetic field, the magnetoresistance effect element using the barber-pole electrodes 114 is considered to become an important device to configure a small ammeter or a power meter. The optimal configuration of the barber-pole electrodes 114 is a very important parameter to improve the sensitivity.

Solution to Problem

The present invention is achieved considering the above problems, and is achieved as a result of studying a configuration of the barber-pole electrodes to improve the efficiency of the magnetoresistance effect element having the barber-pole electrodes.

More specifically, the magnetoresistance effect element according to the present invention is characterized in that the magnetoresistance effect element comprises a strip-shaped magnetic film, a magnetization easy axis being induced in a longitudinal direction of the magnetic film; and a barber-pole electrode formed on the magnetic film with an inclined angle θ with regard to the longitudinal direction, wherein the inclined angle θ is smaller than 45 degrees Advantageous Effects of Invention According to the study and actual proof described below, a current vector is fallen under refraction action at the border from the electrode to the magnetic film in the barber-pole electrode formed so as to have a side inclined with regard to the magnetic film. Therefore, it is impossible to flow a current with an angle of 45 degrees with regard to the magnetization easy axis also by the barber-pole electrode having the inclined side whose inclined angle is formed at 45 degrees.

However, by setting the inclined angle of the inclined side of the barber-pole electrode smaller by the refraction angle, it is possible to set the angle between the magnetization easy axis and the current vector to be 45 degrees, and thus, the operating point can be set at the portion where the linearity of the magnetoresistance effect is superior. Namely, it is possible to obtain a magnetoresistance effect element with barber-pole electrodes most effectively.

DESCRIPTION OF EMBODIMENTS

Hereinafter, a magnetoresistance effect element according to the present invention will be explained with reference to figures. Note that the following explanations are examples of one embodiment according to the present invention, and the present invention is not limited to the following embodiment. As long as not deviating from the point of the invention, the following embodiment can be modified.

Figure 1:
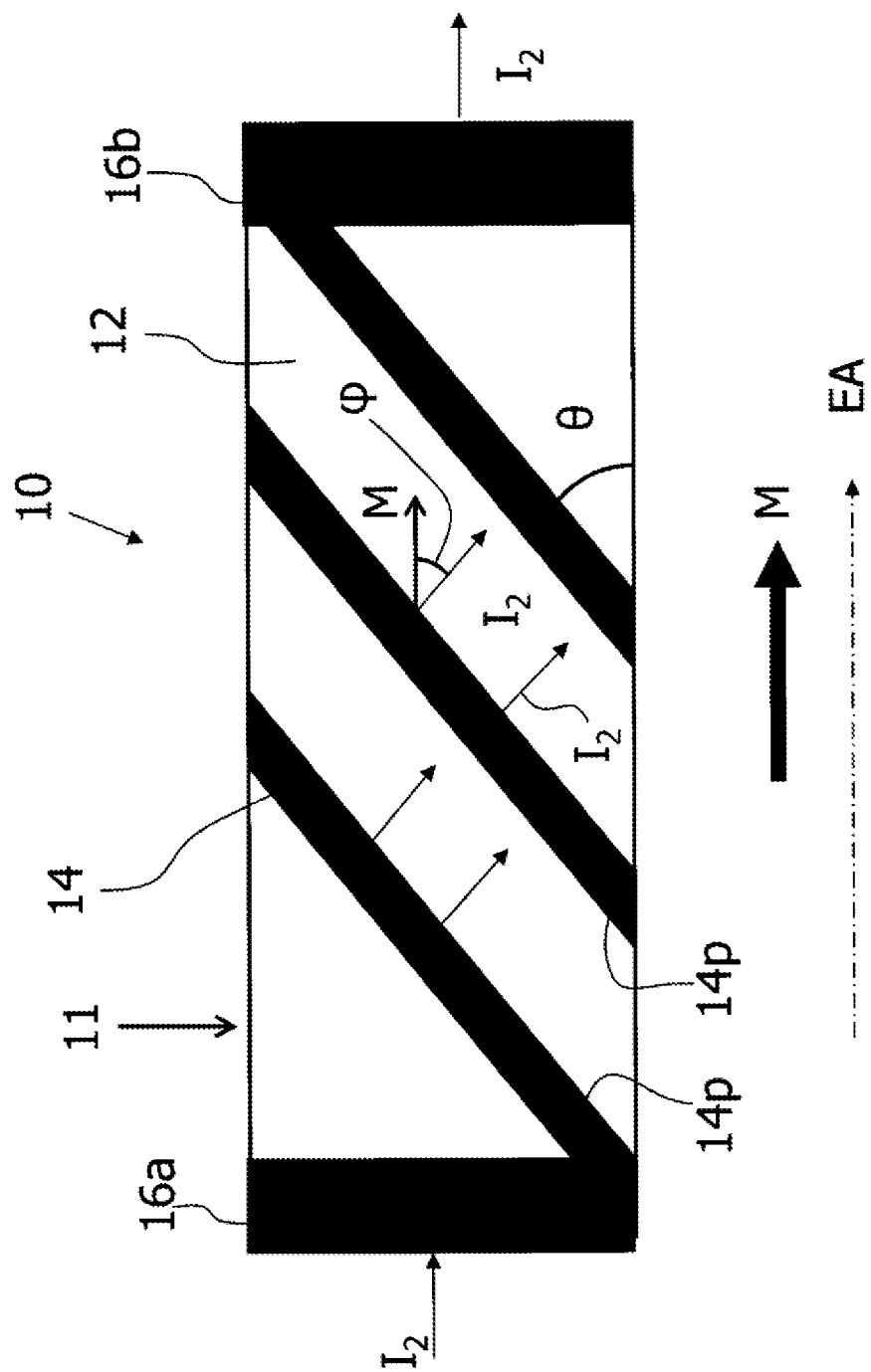
FIG. 1 is a diagram showing a configuration of a magnetoresistance effect element according to the present invention.
Figure 12:
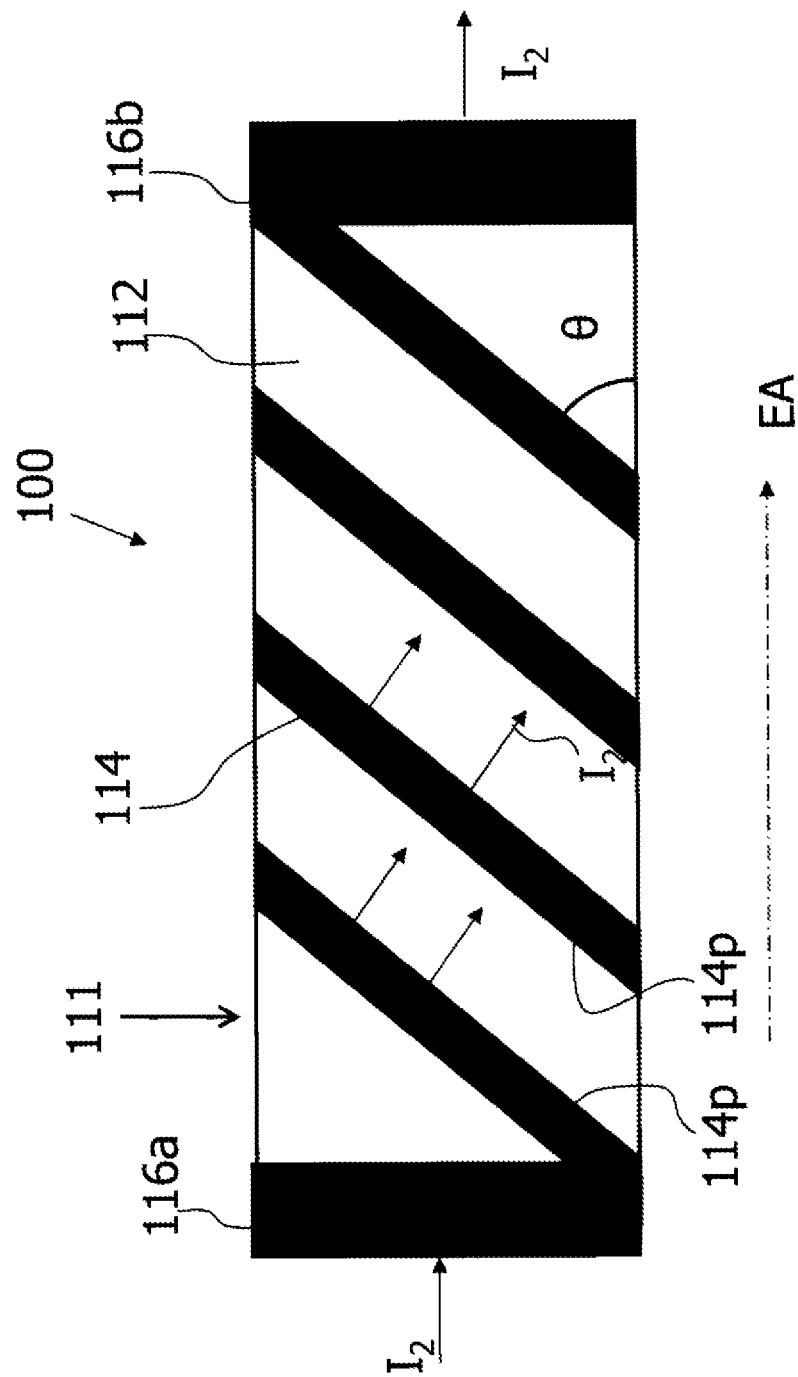
FIG. 12 is a diagram showing a configuration of a conventional magnetoresistance effect element with barber-pole electrodes (inclined angle θ is 45°).

FIG. 1 shows a structure of a magnetoresistance effect element 10 with barber-pole electrodes according to the present invention. The magnetoresistance effect element 10 is basically the same as the one described in FIG. 12. On a substrate 11, a strip-shaped magnetic film 12 is formed. Preferably, the material quality of the substrate 11 is non-magnetic and insulating. More specifically, glass, resin substrate, ceramic can be preferably applied. Surface roughness affects a magnetic character of the magnetic film 12. Preferably, the surface roughness is small and the substrate 11 has a smooth surface. For example, when the surface roughness is expressed by "Ra", it is preferable that the surface roughness "Ra" is ½ to ¹⁄₁₀ of a thickness of the magnetic film 12 formed on the substrate 11.

The magnetic film 12 can be a single layer, or can be formed of multiple layers for obtaining giant magnetoresistance effect. More specifically, material including at least one of iron, cobalt and nickel can be preferably applied.

To form the magnetic film 12, a plating method which enables film formation at normal temperature, a vacuum deposition method and a vacuum sputter method which enable film forming in the vacuum. Further, the strip shape can be formed by using a mask, or by removing, after forming a flat film, an unnecessary portion from the flat film by etching method and so on. Here, "strip-shape" means a shape which is a rectangle having two pairs of facing a pair of sides and one pair of sides is longer than the other pair of sides. Therefore, the rectangle includes trapeziums and parallelograms. Further, the direction of the longer pair of sides is called a longitudinal direction.

When forming the strip magnetic film 12, it is preferable to form it while applying a magnetic field in the longitudinal direction, the aim of which is to induce a magnetization easy axis EA in the longitudinal direction. Of course, the magnetization easy axis EA can be induced after forming the strip-shaped magnetic film 12 by annealing while applying a magnetic field. FIG. 1 shows a status where the magnetization easy axis EA is induced in the longitudinal direction. Further, in this time, FIG. 1 shows that the magnetization M is stable facing the right in the paper.

The barber-pole electrodes 14 can be formed on the magnetic film 12 by the same way as the magnetic film 12. That is, removing an unnecessary portion after film formation by etching and so on, forming the film with formed shape by using a mask, and so on can be applied. Note that, the barber-pole electrodes 14 are directly formed on the magnetic film 12. This is because the current flows from the barber-pole electrodes 14 to the magnetic film 12. However, forming a layer to facilitate the current flowing from the barber-pole electrodes 14 to the magnetic film 12 is not excluded.

Electrodes for connecting (called "connection electrodes 16a and 16b") are provided at both sides of the strip shape on the magnetic film 12. The barber-pole electrodes 14 are belt-like electrodes formed on the strip magnetic film 12 such that inclined sides 14p are parallel to each other. The barber-pole electrodes 14 closest to the connection electrodes 16a and 16b at both sides are conduct with the connection electrodes 16a and 16b, respectively. The number of the barber-pole electrodes 14 is not specifically limited. If at least a pair of inclined sides 14p facing each other across the magnetic film 12, it can be said that the barber-pole electrodes 14 are formed.

The angle between the longitudinal direction and the inclined side 14p of the barber-pole electrode 14 is called "inclined angle θ". The inclined angle θ can be expressed by an angle from 0° to 90°. Note that the angle is expressed by "degree" and may be described as "°". The inclined angle θ of the magnetoresistance effect element 10 according to the present invention is smaller than 45°. Further, it is preferable that the inclined angle θ is equal to or more than 25°, preferably, equal to or more than 30°. Additionally, preferably, the inclined angle θ is a value within ±5° with regard to a value obtained by subtracting from 45° an average value of $\theta_2$ calculated based on an equation (14) mentioned later.

The inclined angle θ is smaller than 45°. However, the current vector $I_2$ is refracted when it moves from the barber-pole electrodes 14 which is a superior conduction material to the magnetic film 12 whose conductive property is smaller than the barber-pole electrodes 14 by approximately single digit. Therefore, by setting the inclined angle θ smaller than 45°, the angle ϕ between the magnetization vector M and the current vector 12 becomes substantially 45°.

Figure 2:
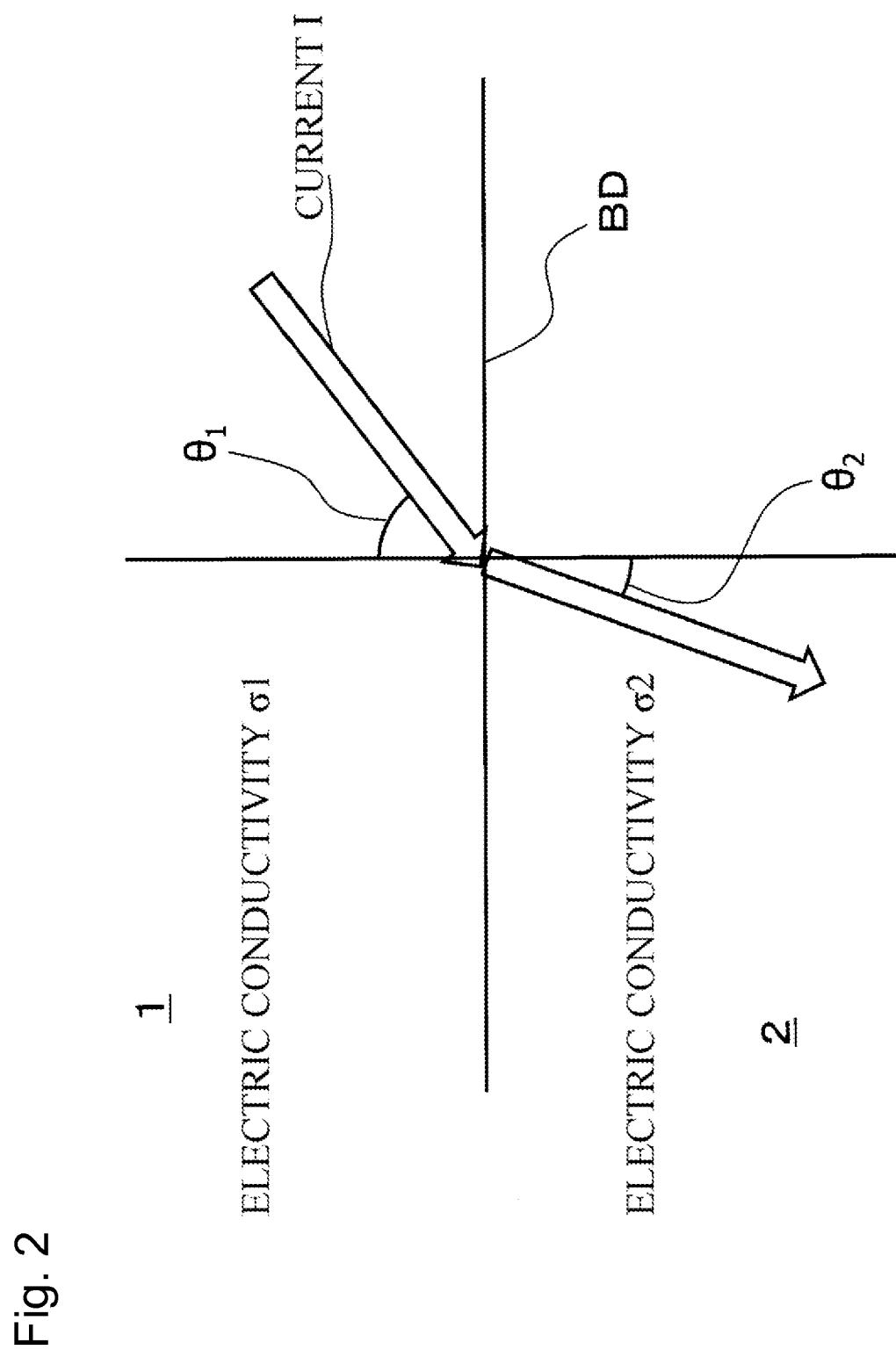
FIG. 2 is a diagram explaining an action of a current vector entering and leaving the border face between substances having different electric conductivities from each other.

Next, the reason to set the inclined angle θ equal to or smaller than 45° will be explained. FIG. 2 shows a condition where current I flows at a border BD between a substance 1 and a substance 2 having electric conductivities $\sigma_1$ and $\sigma_2$, respectively, which are different from each other. When the current I flows at the border BD between substances having the different electric conductivities $\sigma_1$ and $\sigma_2$, respectively, the direction and the magnitude of the current and the electric filed vary. Therefore, relationship between an input angle and a refraction angle when they are passing through the border BD will be obtained.

Firstly, considering a cylinder 3 whose side face 3s is infinitesimally small at the border BD between the substance 1 and the substance 2. The electric conductivity of the substance 1 over the border BD is set $\sigma_1$ and that of the substance 2 under the border BD is set $\sigma_2$. Further, the axis of the cylinder 3 is set numeral sign 4. The normal vector of the cylinder 3 is set a vector n.

Figure 4:
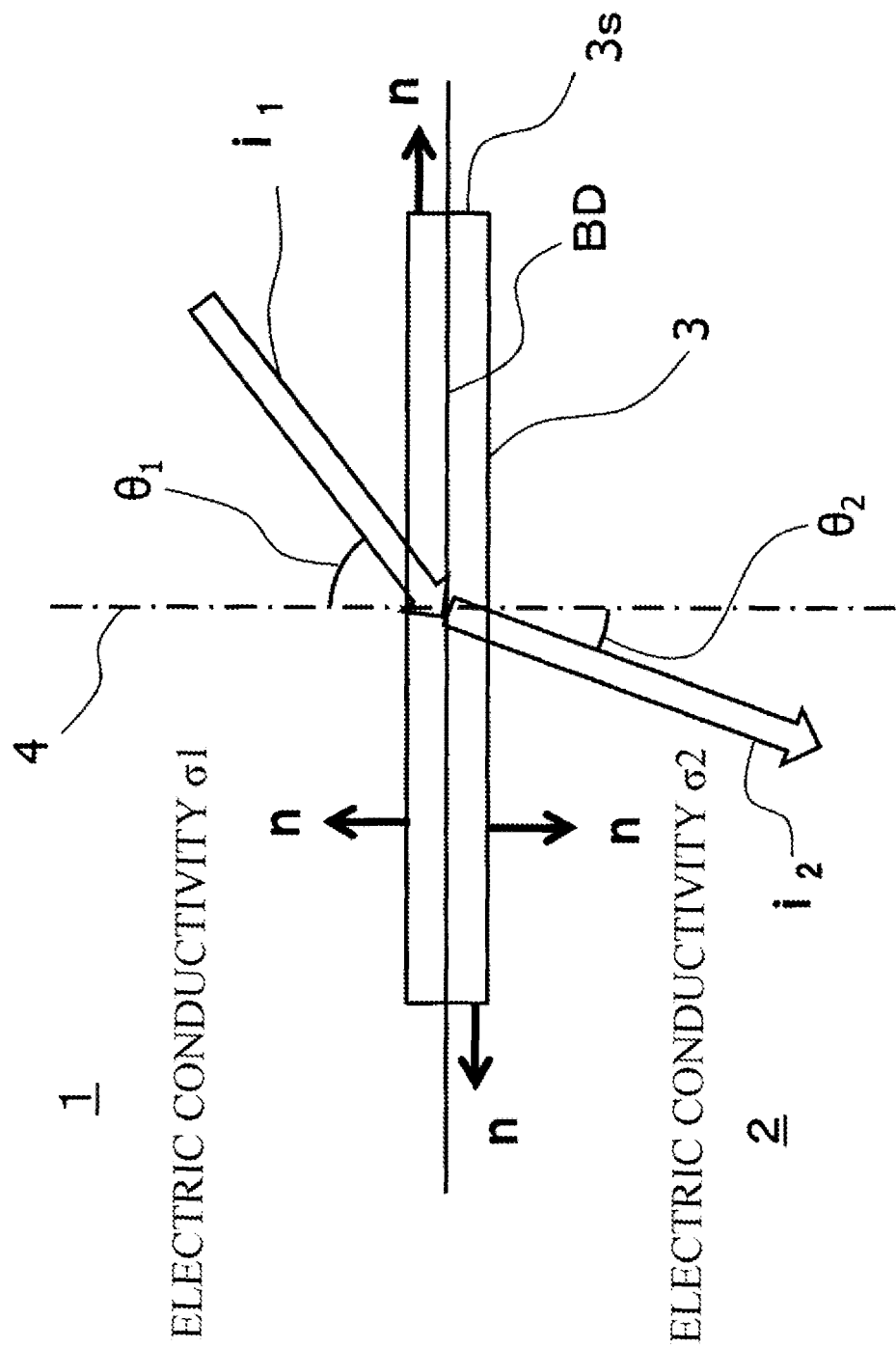
FIG. 4 is a diagram showing a behavior of a current vector i near the border.

FIG. 4 shows a side view of the border BD for easier viewing. Based on the Gauss theorem, an equation (1) is established. Note that, though the vector is described as "vector n" and so on in the description, the vector is expressed by bold type. Further, the current flowing from the substance 1 to the border BD is set a vector $i_1$, and the current flowing from the border BD to the substance 2 is set a vector $i_2$.

[Mathematical formula 1]

$$\int_S E \cdot n dS = \int_P \text{div } E dV \tag{1}$$

Here, the black dot between the vector E and the vector n means an inner product of vectors. Further, when the vector expressing an electric field is set a vector E and the vector expressing an current density is set a vector i, an equation (2) is established because vector i=σ vector E (here, σ is an electric conductivity).

[Mathematical formula 2]

$$\int_S i \cdot n dS = \int_P \text{div } i dV \tag{2}$$

Figure 3:
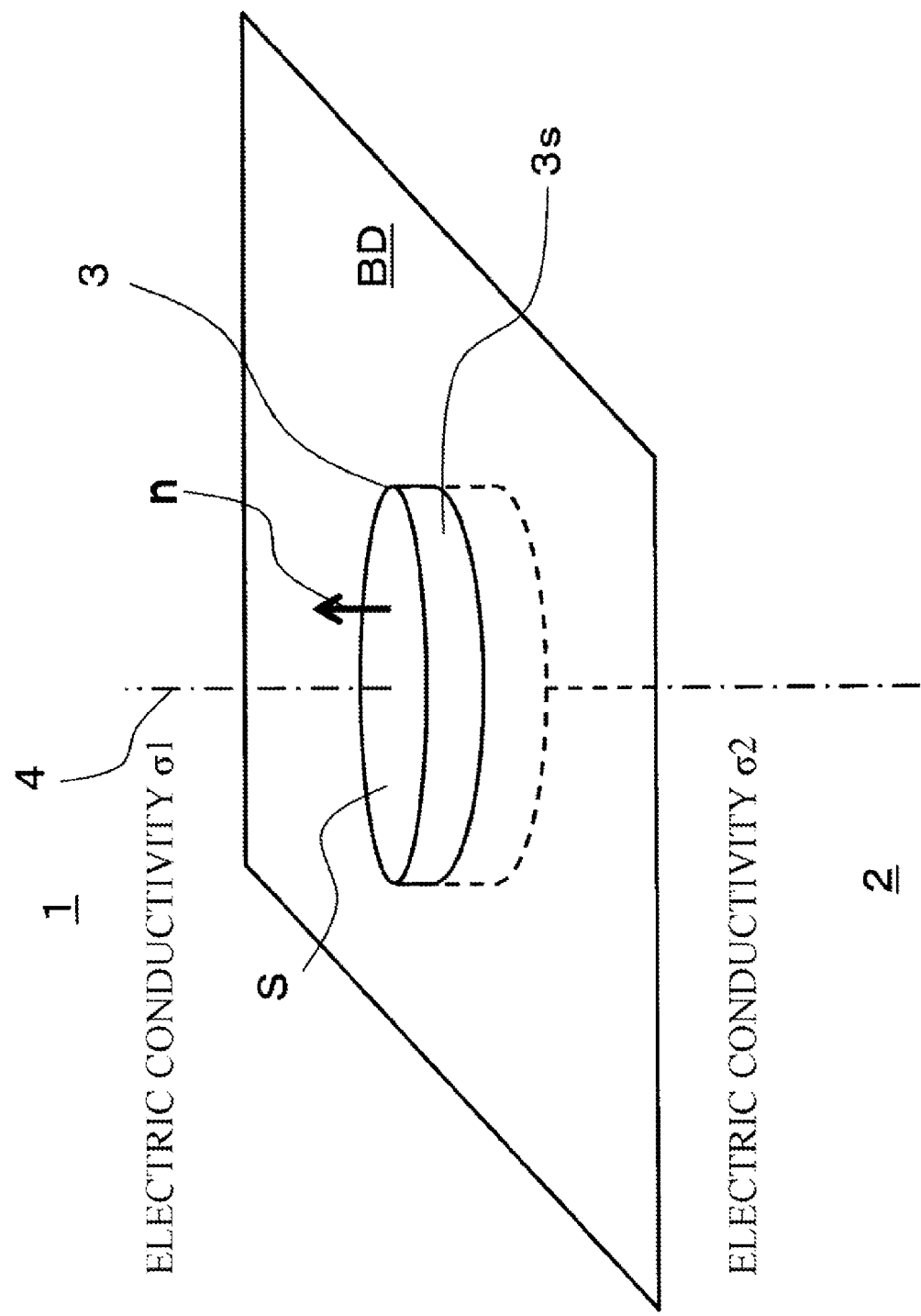
FIG. 3 is a diagram explaining the relationship of FIG. 2 using perspective view.

Though the right-hand side means current generation, the current is never generated because there are no current sources in the cylinder 3 of FIG. 3 (FIG. 4). Therefore, the equation (2) can be rewritten to an equation (3).

[Mathematical formula 3]

$$\int_S i \cdot n dS = 0 \tag{3}$$

When the side face 3s of the cylinder 3 of FIG. 3 (FIG. 4) is approximated to 0 (zero), only the bottom face and the top face should be considered. When the areas of the bottom face and the top face is set S, the equation (3) can be rewritten to an equation (4).

[Mathematical formula 4]

$$\int_{top\ face\ area} i_1 \cdot n dS + \int_{bottom\ face\ area} i_2 \cdot n dS = 0 \tag{4}$$

The equation (4) means that the sum of a vertical component of the current $i_1$ flowing from the substance 1 to the border BD and a vertical component of the current $i_2$ flowing from the border BD to the substance 2 becomes zero. Based on the equation (4), an equation (5) is obtained by considering minuscule area ΔS.

[Mathematical formula 5]

$$i_1 \cdot n \Delta + i_2 \cdot n \Delta S = 0 \tag{5}$$

Since the direction of the normal vector of the top face is opposite to that of the normal vector of the bottom face, an equation (6) is established.

[Mathematical formula 6]

$$i_1 \cos \theta_1 = i_2 \cos \theta_2 \tag{6}$$

Figure 5:
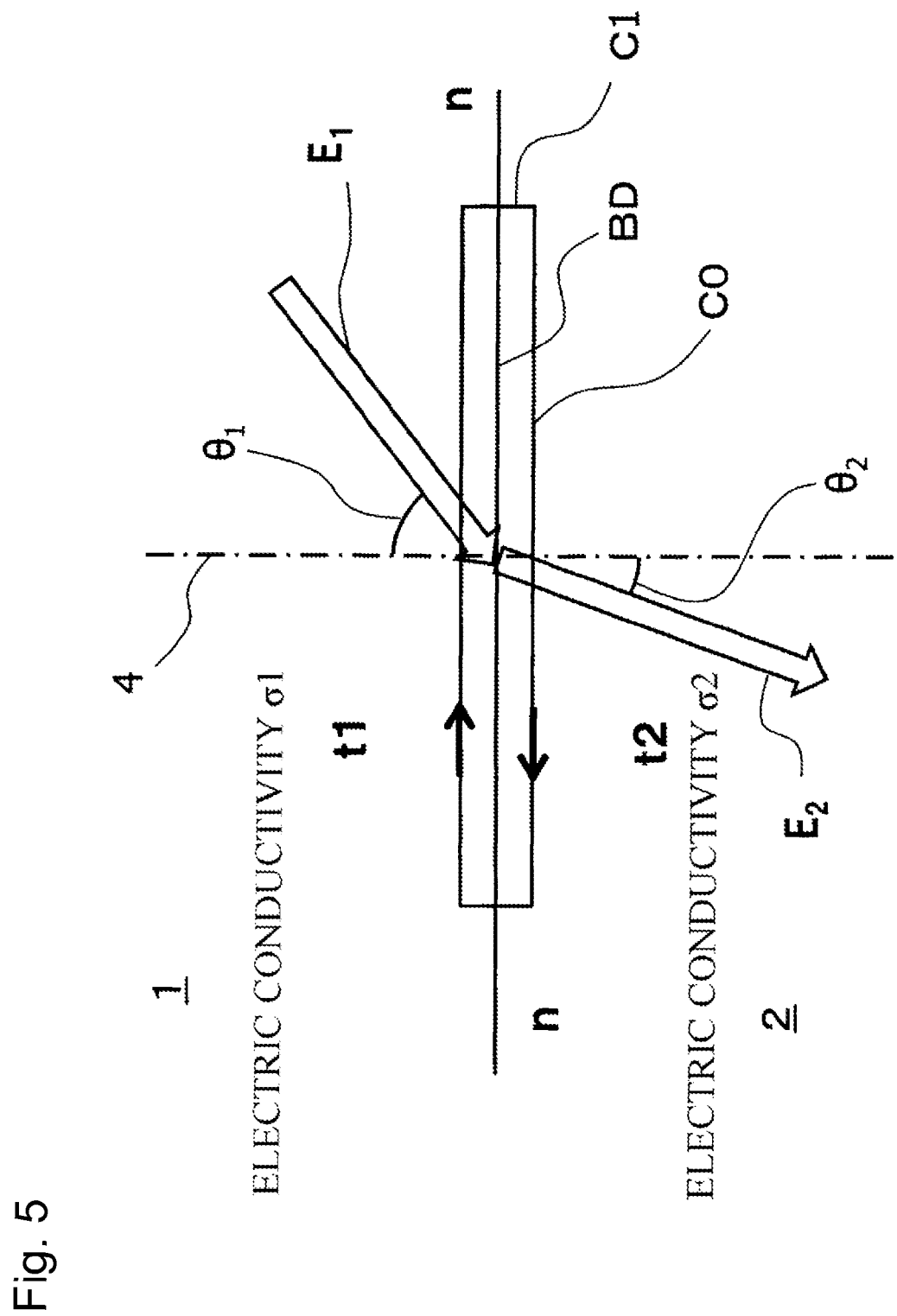
FIG. 5 is a diagram showing a behavior of an electric field vector E near the border.

Next, considering a case where an electric field enters the border BD as shown in FIG. 5. Firstly, considering a closed curve CO of a minuscule rectangle straddling the border BD, and the Gauss theorem (7) defining a static electric field is applied.

[Mathematical formula 7]

$$\int_{CB} E dS = 0 \tag{7}$$

In this time, when the length of the side C1 of the rectangle vertical to the border BD is approximated to 0 (zero), only sides parallel to the border BD should be considered. When unit vectors parallel to the border BD are set a vector t1 and a vector t2, an equation (8) is established as well as the equations (4) and (5). Note that, an electric field traveling from the substance 1 to the border BD is set a vector $E_1$ and an electric field traveling from the border BD to the substance 2 is set to a vector $E_2$.

[Mathematical formula 8]

$$\int_{CB} E dS = E_1 \sin \theta_1 \cdot t1 \cdot \Delta S + E_2 \sin \theta_2 \cdot t2 \Delta S = 0 \tag{8}$$

Since the direction of the vector t1 is opposite to that of the vector t2, an equation (9) is established.

[Mathematical formula 9]

$$E_1 \sin\theta_1 = E_2 \sin\theta_2 \qquad (9)$$

Here, by assigning the relationship vector i=σ vector E to the equation (6), an equation (10) is obtained.

[Mathematical formula 10]

$$\sigma_1 E_1 \cos\theta_1 = \sigma_2 E_2 \cos\theta_2 \qquad (10)$$

Based on the equations (9) and (10), transformation can be done as shown in an equation (11).

[Mathematical formula 11]

$$\left. \begin{array}{c} \dfrac{E_1 \sin\theta_1}{\sigma_1 E_1 \cos\theta_1} = \dfrac{E_2 \sin\theta_2}{\sigma_2 E_2 \cos\theta_2} \\ \dfrac{\tan\theta_1}{\sigma_1} = \dfrac{\tan\theta_2}{\sigma_2} \\ \dfrac{\tan\theta_1}{\tan\theta_2} = \dfrac{\sigma_1}{\sigma_2} \end{array} \right\} \qquad (11)$$

This can be used as a law of refraction in a case where a current flows at a border between substances having different electric conductivities. Here, output angle $\theta_2$ can be obtained as shown in an equation (12).

[Mathematical formula 12]

$$\theta_2 = \tan^{-1}\left(\dfrac{\sigma_2}{\sigma_1}\tan\theta_1\right) \qquad (12)$$

Base on the equation (11) or (12), when $\sigma_2 \gg \sigma_1$, $\theta_2 \gg \theta_1$. When, $\theta_2 \ll \theta_1$, it is found that $\theta_2 \ll \theta_1$. This means that when entering a substance having lower electric conductivity from a substance having higher electric conductivity, the output angle $\theta_2$ becomes smaller with regard to the input angle $\theta_1$, and when in a reverse case, the output angle $\theta_2$ becomes larger.

Figure 6:
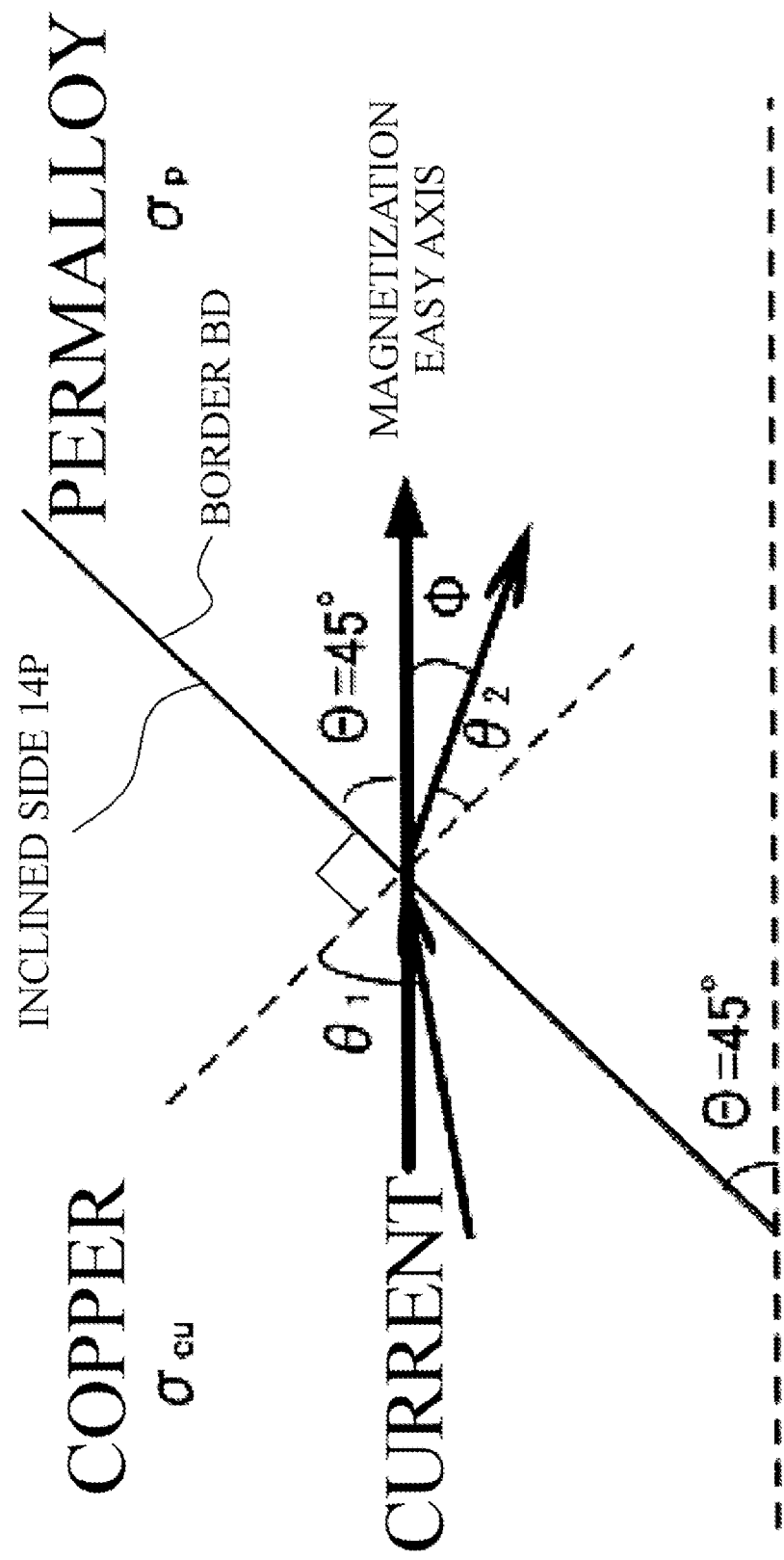
FIG. 6 is a diagram showing a relationship between the barber-pole electrodes and the magnetic film.

Next, the inclined side 14p of the barber-pole electrodes 14 as shown in FIG. 6 will be considered. The left side whose border is the border BD of the paper is the barber-pole electrode 14. It is assumed that this is made of a copper as a material quality. Therefore, the electric conductivity is set $\sigma_{Cu}$. On the other hand, the right side of the paper is the permalloy, and the electric conductivity thereof is set σp. Note that, the angle between the inclined side 14p of the barber-pole electrode 14 and the longitudinal direction of the magnetic film 12 is the inclined angle θ. Here, it is assumed that θ=45°.

The magnetization easy axis EA faces to the horizontal direction. The horizontal direction of FIG. 6 is the longitudinal direction of the magnetoresistance effect element 10. Therefore, in the magnetic film 12, in order for the current flow to be substantially 45° with regard to the longitudinal direction, the output angle $\theta_2$ has to be small enough. To lessen the $\theta_2$, $\theta_1$ should be small. However, based on the equation (12), the ratio between the electric conductivities of the two materials over the border BD also matters. Namely, in the equation (12), when $\sigma_1 \gg \sigma_2$, $\theta_2$ becomes small.

Figure 7:
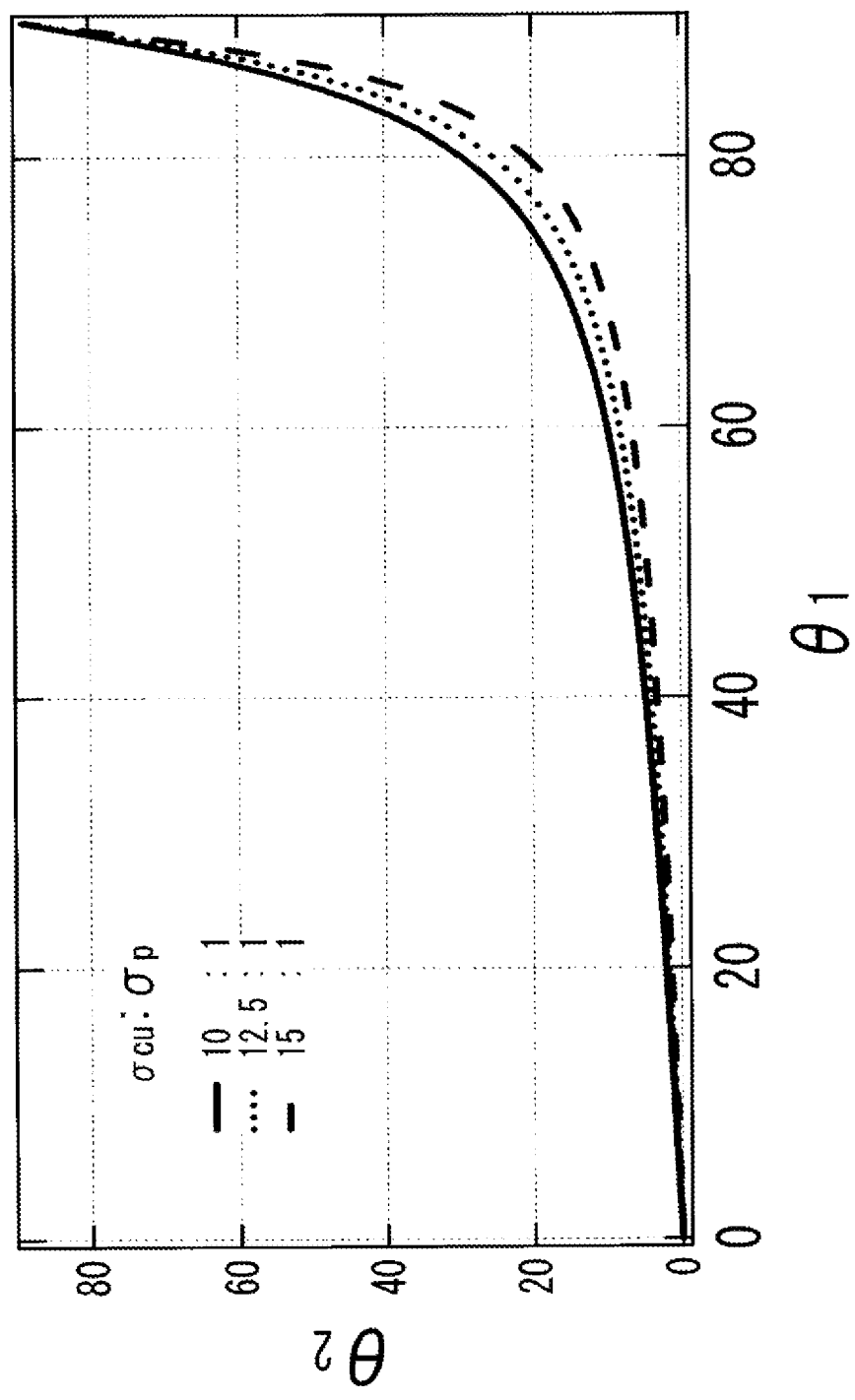
FIG. 7 is a graph showing a relationship between the input angle and the output depending on the difference of the electric conductivity.

FIG. 7 shows a graph showing a relation between $\theta_2$ and $\theta_1$ of the equation (12) for each different ratio of electric conductivities. The horizontal axis shows $\theta_1$, and the vertical axis shows $\theta_2$. $\theta_1$ is an input angle when the current flows into the border BD. $\theta_2$ is an output angle when the current flows from the border BD. Now, it is aimed that $\sigma_2$ becomes zero. Firstly, when $\theta_1$ becomes small, $\theta_2$ also becomes small drastically. When a ratio between $\sigma_1$ and $\sigma_2$ becomes small, the tendency for $\theta_2$ to become small is rapid. Note that in FIG. 7, $\sigma_1$ is $\sigma_{Cu}$, and $\sigma_2$ is $\sigma_P$. Further, the solid line shows that $\sigma_{Cu}:\sigma_P$ is 10:1, the fine dashed line shows that $\sigma_{Cu}:\sigma_P$ is 12.5:1, and the long dashed line shows that $\sigma_{Cu}:\sigma_P$ is 15:1.

Referring to FIG. 6 again, when a current flows perpendicular to the border BD ($\theta_1=0$), $\theta_2=0$ because the current does not refracted and travels straightly. The fact that $\theta_2$ is 0 means that the angle with regard to the magnetization of the magnetic film becomes 45°. However, this is an ideal case, and practically, it is considered that currents having various angles pass through the border BD.

As stated above, with regard to the magnetoresistance effect, it is possible to utilize a portion having the best linearity when an angle between the magnetization and a current is 45°, and it is said that sensitivity becomes high. Taking a refraction law as mentioned above into consideration, when it is assumed that the magnetization faces the longitudinal direction of the magnetic film 12, the angle between the current vector and the magnetization vector becomes ($45-\theta_2$), which is shifted by a refraction angle from 45°. Namely, in order to correct the shift of the refraction angle, it is necessary to set the inclined angle to be ($45-\theta_2$).

From FIG. 6, $\theta_2$ can be $0°<\theta_2<90°$. However, in order for $\theta_2$ where the resistance variation becomes zero to occur at 45° or more, the input angle $\theta_1$ has to be about 85° to 90°. However, since in a case of the magnetoresistance effect element 10 having the barber-pole electrodes 14, it is difficult to say that the width and the length of the barber-pole electrodes 14 is not sufficiently large, a case where the input angle of the current is smaller than 85° happens more frequently than other case, and thus, it is considered that the output angle $\theta_2$ is smaller than 45°.

Here, under an assumption that the input angle $\theta_1$ of the current to the border BD is distributed over $0°<\theta_{1<84}°$ evenly, an average value of $\theta_2$ is obtained as shown in an equation (13).

[Mathematical formula 13]

$$\dfrac{1}{85}\sum_{0}^{84}\theta_2 = \dfrac{1}{85}\sum_{\theta_2=0}^{84}\tan^{-1}\left(\dfrac{\sigma_2}{\sigma_1}\tan\theta_1\right) \approx 8.5 \qquad (13)$$

The center member of the equation (13) is called an "average value of $\theta_2$". Note that $\sigma_1$ is an electric conductivity of the barber-pole electrodes 14 and $\sigma_2$ is an electric conductivity of the magnetic film 12, and $\sigma_1 > \sigma_2$. The "average value of $\theta_2$" is expressly shown in an equation (14).

[Mathematical formula 14]

$$\text{average value of } \theta_2 = \dfrac{1}{85}\sum_{\theta_2=0}^{84}\tan^{-1}\left(\dfrac{\sigma_2}{\sigma_1}\tan\theta_1\right) \qquad (14)$$

When the current flowing in the barber-pole electrodes 14 (copper) exits to the magnetic film 12, the angle of the current slightly changes. Therefore, when the angle of the stripe of the barber-pole electrodes 14 (inclined angle $\theta_2$) is set smaller by about 8° than 45° to set the angle about 37°, the current flows in a 45° direction with regard to the horizontal direction (magnetization easy axis EA). That is, it is preferable that the inclined angle θ is set to be a value obtained by subtracting the average value of $\theta_2$ from 45°. Note that, taking the error at a time of manufacturing into consideration, further range of ±5° can be modified.

Furthermore, when θ is set small, the area facing the neighboring barber-pole electrodes 14 becomes larger. Therefore, the area where the current flows in 45° direction with regard to the horizontal direction becomes larger, and thus, the effect that the resistance variation becomes larger can be conceived.

Working Example

Figure 8:
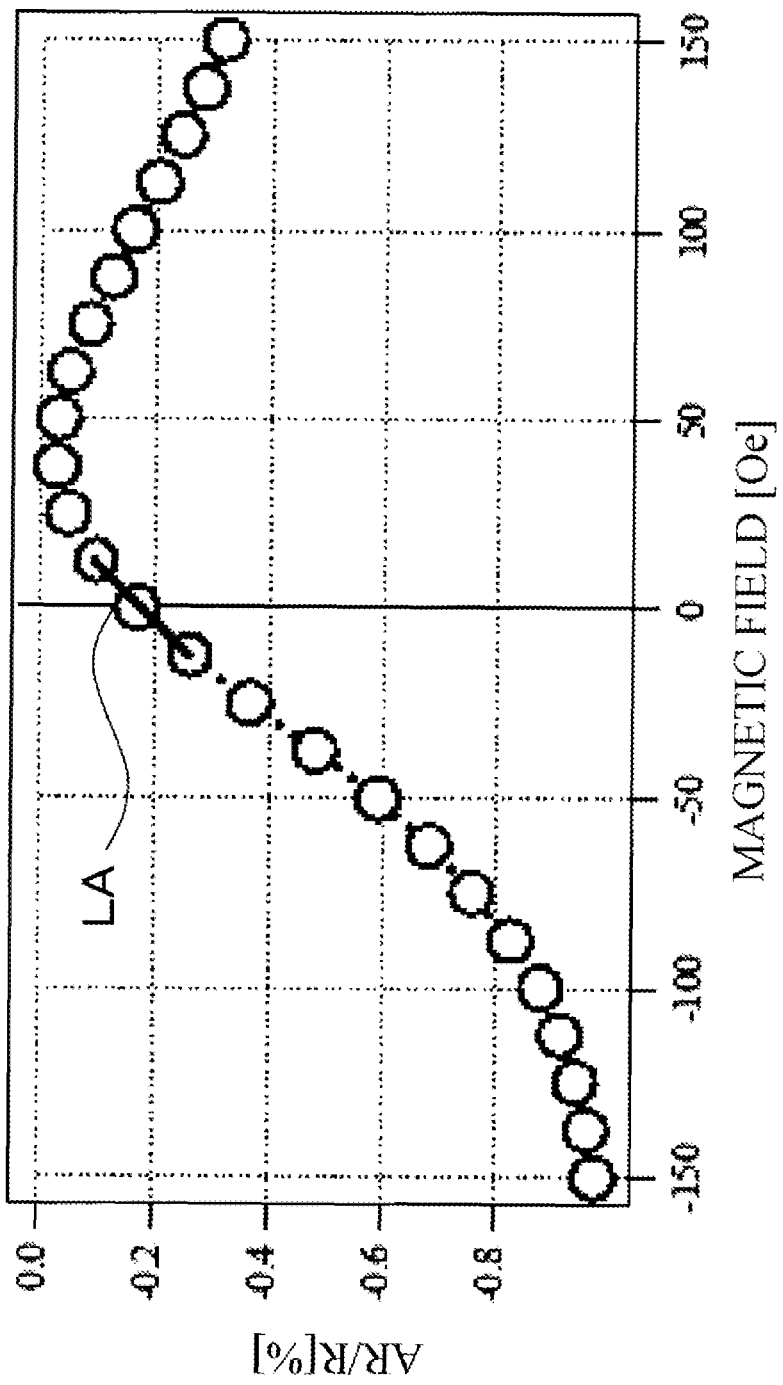
FIG. 8 is a graph of a character of the magnetoresistance effect element with the barber-pole electrodes manufactured so as to have the inclined angle θ of 45°.

FIG. 8 shows a result of a measurement of the magnetoresistance effect of the magnetoresistance effect element 10 by manufacturing the magnetoresistance effect element 10 on which the inclined side 14p of the barber-pole electrodes 14 (copper) is provided with the inclined angle θ=45° with regard to the longitudinal direction of the magnetoresistance effect element 10. The horizontal axis shows a strength of a magnetic field applied from outside (Oe: Oersted), and the vertical axis is the magnetoresistance effect ΔR/R (%). Here, R is a resistance value of the magnetic film 12 when no magnetic field is applied from outside and ΔR is the variation amount of the resistance value when the magnetic field is applied.

The width of the magnetic film 12 is 50 μm, and the space between the barber-pole electrodes 14 is 40 μm. Although changing the current direction by 45 degrees with regard to the magnetization direction was tried, according to the magnetoresistance effect property of the actual element as shown in FIG. 8, the linear region LA occurs at an upper half of a dynamic range of the magnetoresistance, thus, it is found that targeted shift cannot be realized.

In more detail, the operating point (point where the magnetic field is 0 [Oe]) was not positioned at the middle of the resistance variation of the magnetoresistance effect, namely, the center of the linear portion, but positioned at about 17% of the magnetoresistance effect. At the same time, the linear region LA at the operating point (point where the magnetic field is 0 [Oe]) is narrow as shown in FIG. 8.

Figure 9:
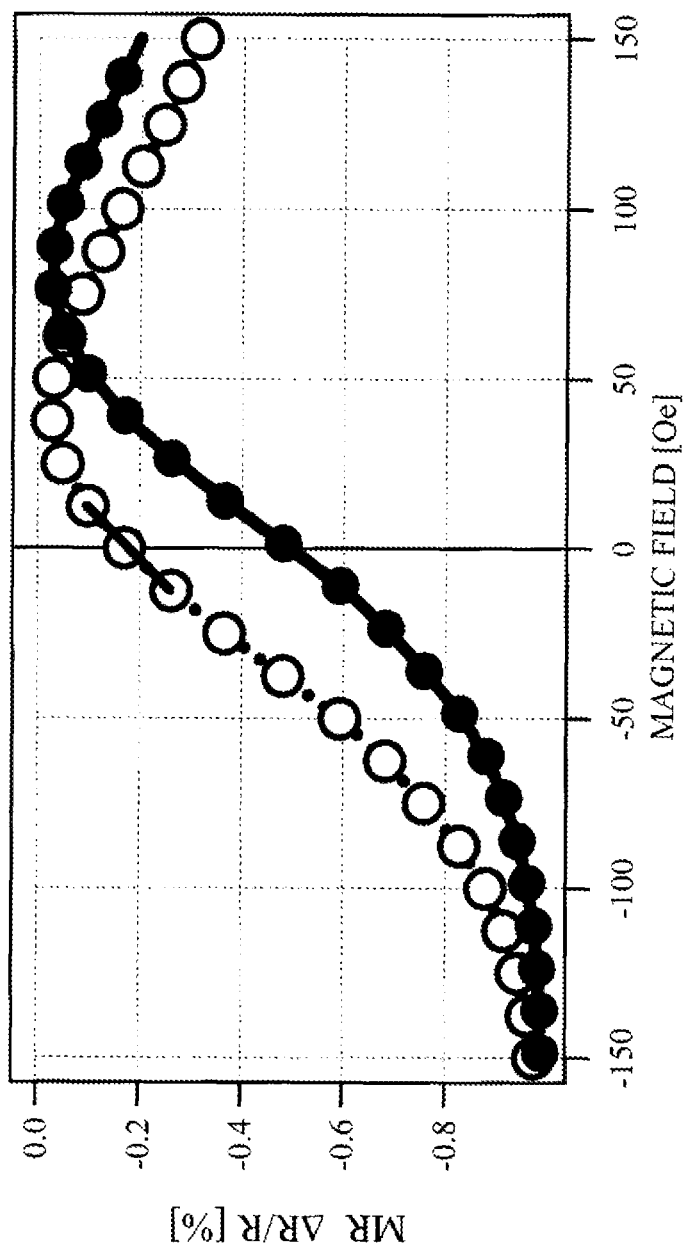
FIG. 9 is a graph in which a character obtained by shifting the character of FIG. 8 by 400e is written.

FIG. 9 shows a character of the magnetoresistance effect of the trial element and a character curve (black circle) obtained by shifting the character thereof (white circle) by about 400 Oe in the positive magnetic field direction such that the operating point (point where the magnetic field is 0 [Oe]) is positioned at the center of the resistance variation. The horizontal axis shows strength of a magnetic field applied from outside (Oe: Oersted), and the vertical axis is the magnetoresistance effect ΔR/R (%). It is clear from the figure that the linear region LA which is an operating range and the sensitivity (gradient of the variation) improve, and it is found that an excellent character as a sensor is obtained.

Considering the refraction of the current at the border BD between the barber-pole electrodes 14 (copper) and the magnetic film as shown in FIG. 6, the output angle $\theta_2$ is expressed by an equation (15) based on the law of refraction of current under an assumption that the current flows from the barber-pole electrode 14 (copper) to strip magnetic film 12 with the input angle $\theta_1$.

[Mathematical formula 15]

$$\theta_2 = \tan^{-1}\left(\frac{\sigma_P}{\sigma_{Cu}}\tan\theta_1\right) \quad (15)$$

Figure 10:
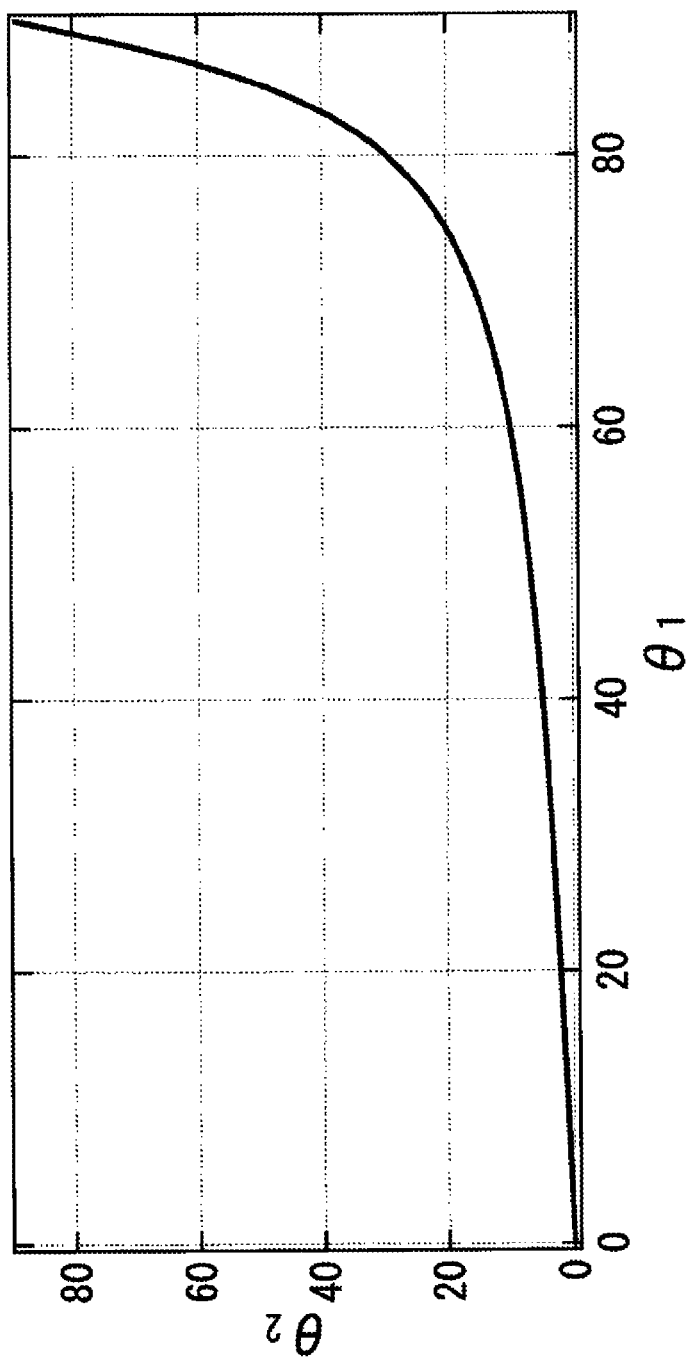
FIG. 10 is a graph showing only a case where the ratio of the electric conductivity is 10:1 among FIG. 7.

By using permalloy for the magnetic film 12, the electric conductivity thereof becomes about 1/10 of copper. Based on the above, a graph of a relation between $\theta_1$ and $\theta_2$ is again shown in FIG. 10.

When the current enters with an angle of $\theta_1$ being between 0° to 90°, the average value of the output angle corresponding to the input angle can be calculated as $\theta_2$=10° based on the equation (13). It can be supposed that φ (angle between the current and the magnetic field) is lessened by $\theta_2$. According to this, it is necessary to change the angle of the barber-pole electrodes 14 (copper) to lessen the inclined angle θ. Further, by lessening the inclined angle θ, the length of the electrode facing the electrode can be lengthened.

Based on the above, comparing to the trial element shown in FIG. 8, the element having the space between the barber-pole electrodes 14 being set to 20 μm and having the inclined angle θ=35°, is manufactured to measure the magnetoresistance variation.

Figure 11:
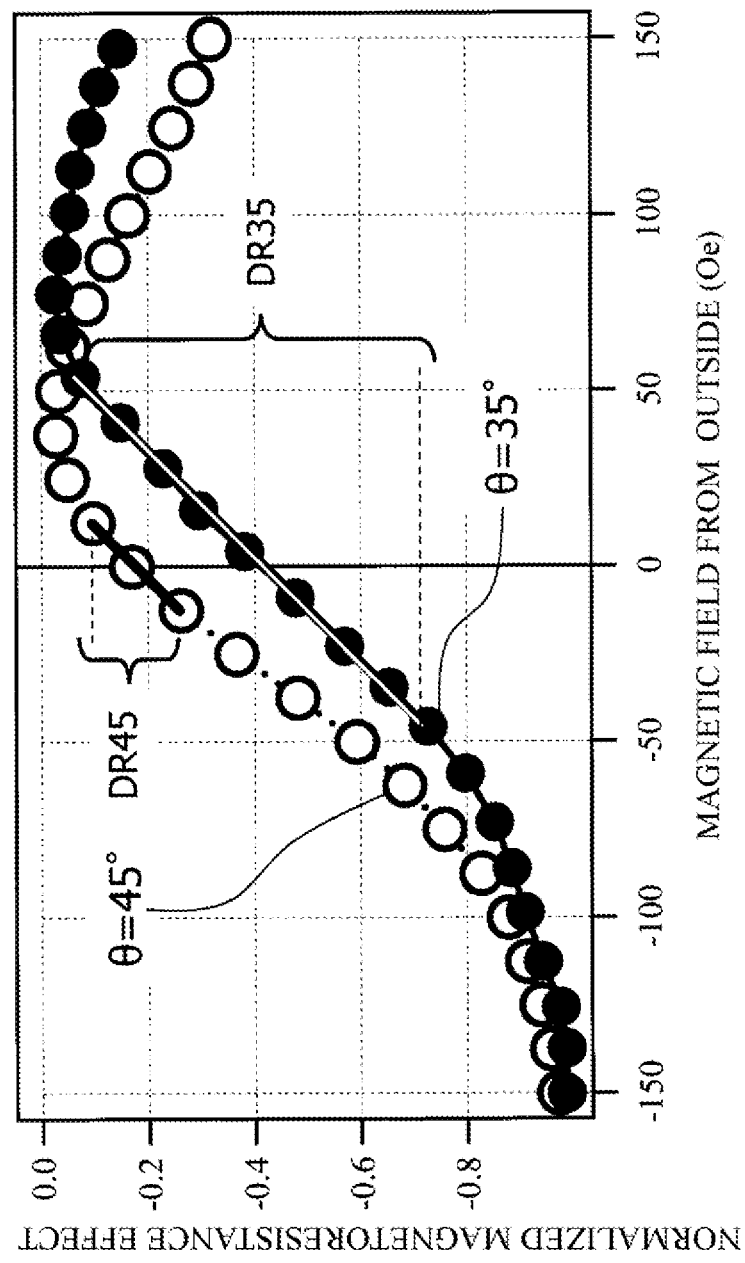
FIG. 11 is a graph comparing the character of the magnetoresistance effect element manufactured so as to have the inclined angle θ of 35° and that manufactured so as to have the inclined angle θ of 45°.

The result is shown in FIG. 11. The horizontal axis shows strength of a magnetic field applied from outside, and the vertical axis is a normalized magnetoresistance effect. The vertical axis is a ratio (from 0 to −1.0) so as to match the maximum and minimum values of the magnetoresistance effect in a case where the inclined angle θ is 45° (white circle) with those in a case where the inclined angle θ is 35° (black circle).

The while circles show a case where the inclined angle θ is 45°, and the black circles show a case where the inclined angle θ is 35°. Further, the black line and the white line show each linear region. The linear region when the inclined angle θ is 45° is defined as DR45, and that when the inclined angle θ is 35° is defined as DR35.

According to FIG. 11, comparing to a case where the inclined angle θ is 45°, by setting the inclined angle θ to 35°, the operating point (the point where the magnetic field is 0 [Oe]) is obviously moved to the near center of the resistance variation (vertical axis) and the operating range (linear regions DR35 and DR45) is drastically widened. Further, comparing to the gradient of the black line, that of the white line becomes a bit steeper, which means that it can be said that the sensitivity improves at the same time.

According to the above, it is found that the magnetoresistance effect can be approached to an ideal condition by narrowing the space of the electrodes taking a distribution of a current flowing in the barber-pole electrode, an entering angle and a distribution of a current to the border between the barber-pole electrode and the magnetic film, and a diffraction phenomenon of a current generated due to an electric conductivity (resistivity) of a barber-pole electrode portion and that of a magnetic film into consideration. In other word, it is found that optimizing a configuration of the barber-pole electrodes drastically improve the sensitivity and the operating range of the barber-pole type magnetic thin film power sensor.

INDUSTRIAL APPLICABILITY

The magnetoresistance effect element according to the present invention can be effectively used to realize a small ammeter and a small power meter.

REFERENCE SIGNS LIST

1 substance whose electric conductivity is $\sigma_1$
2 substance whose electric conductivity is $\sigma_2$ 10 magnetoresistance effect element
11 substrate
12 magnetic film
14 barber-pole electrode
14p inclined side
16a, 16b connection electrodes
100 magnetoresistance effect element
111 substrate
112 magnetic film
114 barber-pole electrode
114p inclined side
116a, 11b connection electrodes
EA magnetization easy axis
M magnetization
θ inclined angle
φ angle between current vector and magnetization vector

The invention claimed is:

1. A method for manufacturing a magnetoresistance effect element, the method comprising:
   determining an inclined angle θ of a barber-pole electrode with regard to a longitudinal direction of a magnetic film based on an electric conductivity of the barber-pole electrode σ1 and an electric conductivity of the magnetic film σ2, the inclined angle θ being smaller than 45°;
   forming the magnetic film, a magnetization easy axis being induced in the longitudinal direction of the magnetic film; and
   forming the barber-pole electrode on or above the magnetic film with the determined inclined angle θ with regard to the longitudinal direction of the magnetic film.

2. The method of claim 1, wherein upon determining the inclined angle θ, the inclined angle θ is determined based on an average value of θ2 shown in an equation, the equation reciting:

$$\text{average value of } \theta_2 = \frac{1}{85} \sum_{\theta_2=0}^{84} \tan^{-1}\left(\frac{\sigma_2}{\sigma_1} \tan\theta_1\right). \tag{14}$$

3. The method of claim 2, wherein upon determining the inclined angle θ, the inclined angle θ is determined within ±5° with regard to a value obtained by subtracting the average value of θ2 from 45°.

4. The method of claim 1, wherein upon determining the inclined angle θ, the inclined angle θ is determined so that an angle between the longitudinal direction and a current vector in the magnetic film becomes substantially 45°.

5. A method for determining an inclined angle θ of a barber-pole electrode with regard to a longitudinal direction of a magnetic film in a magnetoresistance effect element comprising the magnetic film and the barber-pole electrode on or above the magnetic film wherein a magnetization easy axis is induced in the longitudinal direction of the magnetic film, the method comprising:
   determining the inclined angle θ based on an electric conductivity of the barber-pole electrode σ1 and an electric conductivity of the magnetic film σ2, the inclined angle θ being smaller than 45°.

6. The method of claim 5, wherein upon determining the inclined angle θ, the inclined angle θ is determined based on an average value of θ2 shown in an equation, the equation reciting:

$$\text{average value of } \theta_2 = \frac{1}{85} \sum_{\theta_2=0}^{84} \tan^{-1}\left(\frac{\sigma_2}{\sigma_1} \tan\theta_1\right). \tag{14}$$

7. The method of claim 6, wherein upon determining the inclined angle θ, the inclined angle θ is determined within ±5° with regard to a value obtained by subtracting the average value of θ2 from 45°.

8. The method of claim 5, wherein upon determining the inclined angle θ, the inclined angle θ is determined so that an angle between the longitudinal direction and a current vector in the magnetic film becomes substantially 45°.

* * * * *